(12) United States Patent
Lee et al.

(10) Patent No.: US 11,469,361 B2
(45) Date of Patent: Oct. 11, 2022

(54) THERMOELECTRIC MODULE

(71) Applicant: LG INNOTEK CO., LTD., Seoul (KR)

(72) Inventors: Jong Min Lee, Seoul (KR); Yong Sang Cho, Seoul (KR); Jong Hyun Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/766,856

(22) PCT Filed: Nov. 19, 2018

(86) PCT No.: PCT/KR2018/014165
§ 371 (c)(1),
(2) Date: May 26, 2020

(87) PCT Pub. No.: WO2019/112200
PCT Pub. Date: Jun. 13, 2019

(65) Prior Publication Data
US 2020/0321505 A1 Oct. 8, 2020

(30) Foreign Application Priority Data

Dec. 7, 2017 (KR) .......................... 10-2017-0167652
Nov. 16, 2018 (KR) .......................... 10-2018-0141828

(51) Int. Cl.
*H01L 35/32* (2006.01)
(52) U.S. Cl.
CPC .................................... *H01L 35/32* (2013.01)
(58) Field of Classification Search
None
See application file for complete search history.

(56) References Cited

U.S. PATENT DOCUMENTS

2006/0005873 A1   1/2006   Kambe et al.
2007/0028955 A1   2/2007   Sogou et al.
(Continued)

FOREIGN PATENT DOCUMENTS

JP   2005-353621   12/2005
JP   2006-032723   2/2006
(Continued)

OTHER PUBLICATIONS

International Search Report dated Feb. 12, 2019 issued in Application No. PCT/KR2018/014165.
(Continued)

*Primary Examiner* — Dustin Q Dam
(74) *Attorney, Agent, or Firm* — KED & Associates LLP

(57) ABSTRACT

Disclosed is an embodiment is a thermoelectric module comprising: a first thermally conductive plate; a thermoelectric element arranged on the first thermally conductive plate; a second thermally conductive plate arranged on the thermoelectric element; and a cover frame, which is arranged on the first thermally conductive plate, and has an accommodation space such that the thermoelectric element is accommodated in the accommodation space, wherein the thermoelectric element includes: a first substrate; a plurality of thermoelectric legs arranged on the first substrate; a second substrate arranged on the plurality of thermoelectric legs; and electrodes comprising a plurality of first electrodes arranged between the first substrate and the plurality of thermoelectric legs; and a plurality of second electrodes arranged between the second substrate and the plurality of thermoelectric legs, and the cover frame includes: an outer frame arranged to be spaced from the thermoelectric element on the first thermally conductive plate; and an upper frame extending toward the second thermally conductive plate so (Continued)

as to be inclined from the upper end of the outer frame toward the downward direction thereof.

18 Claims, 16 Drawing Sheets

(56) References Cited

U.S. PATENT DOCUMENTS

| | | | |
|---|---|---|---|
| 2013/0061900 A1* | 3/2013 | Tachibana | H01L 35/32 |
| | | | 136/203 |
| 2015/0155465 A1 | 6/2015 | Himmer | |
| 2015/0280097 A1* | 10/2015 | Jinushi | H01L 35/30 |
| | | | 136/205 |

FOREIGN PATENT DOCUMENTS

| | | |
|---|---|---|
| JP | 2006-049872 | 2/2006 |
| JP | 2007-110082 | 4/2007 |
| JP | 2012-119457 | 6/2012 |
| JP | 2012-156227 | 8/2012 |
| JP | 2014-075541 | 4/2014 |
| KR | 10-2012-0009161 | 2/2012 |

OTHER PUBLICATIONS

European Search Report dated Aug. 19, 2021 issued in Application No. 18885309.7.

* cited by examiner

[FIG.1]
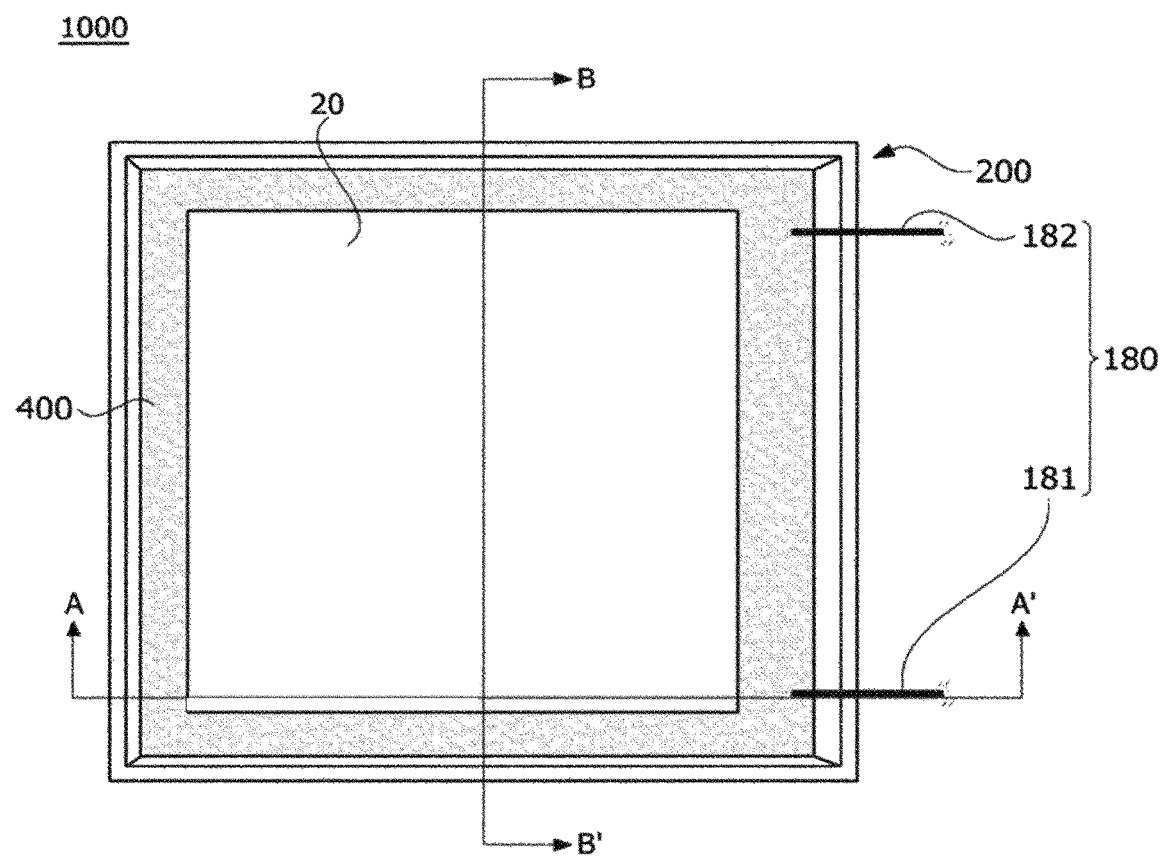

[FIG.2A]
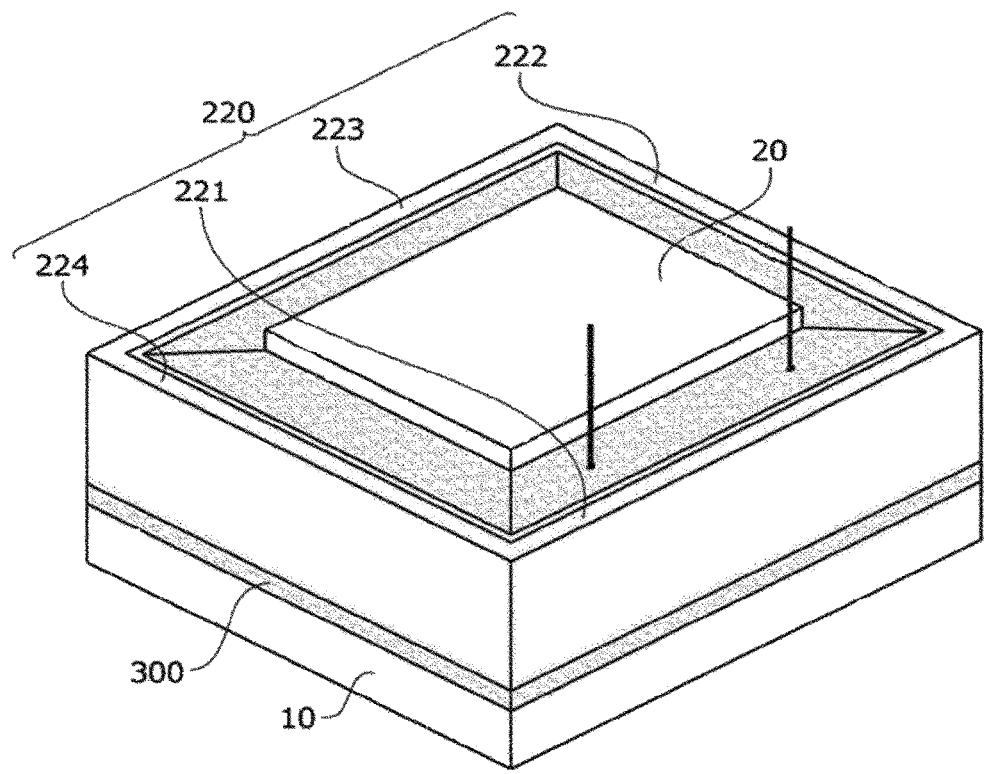

[FIG.2B]
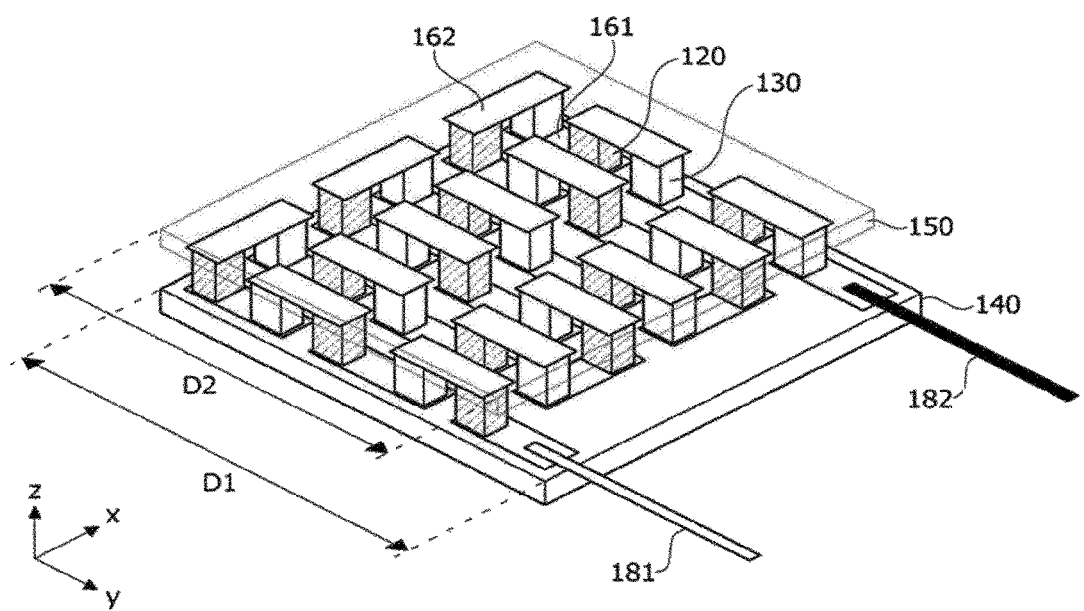

[FIG.3]
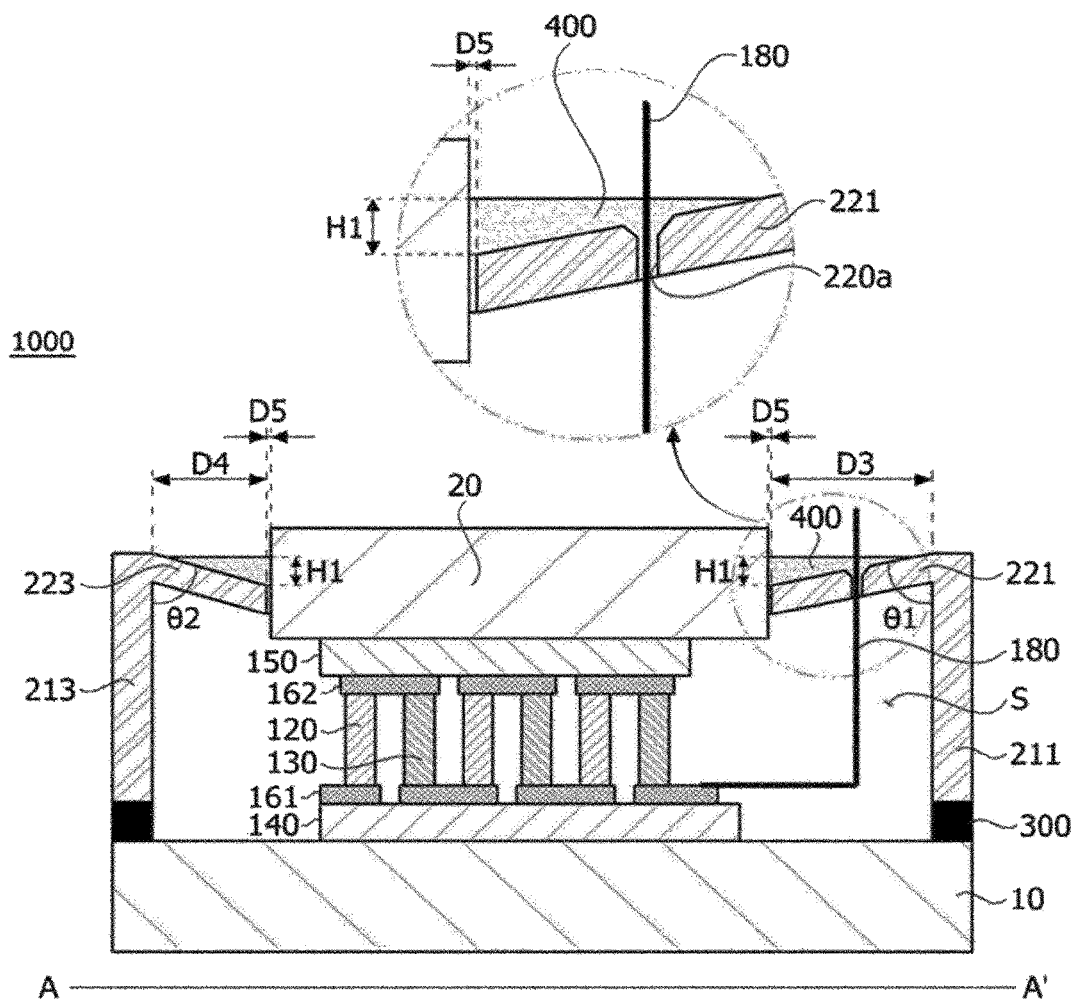

[FIG.4]
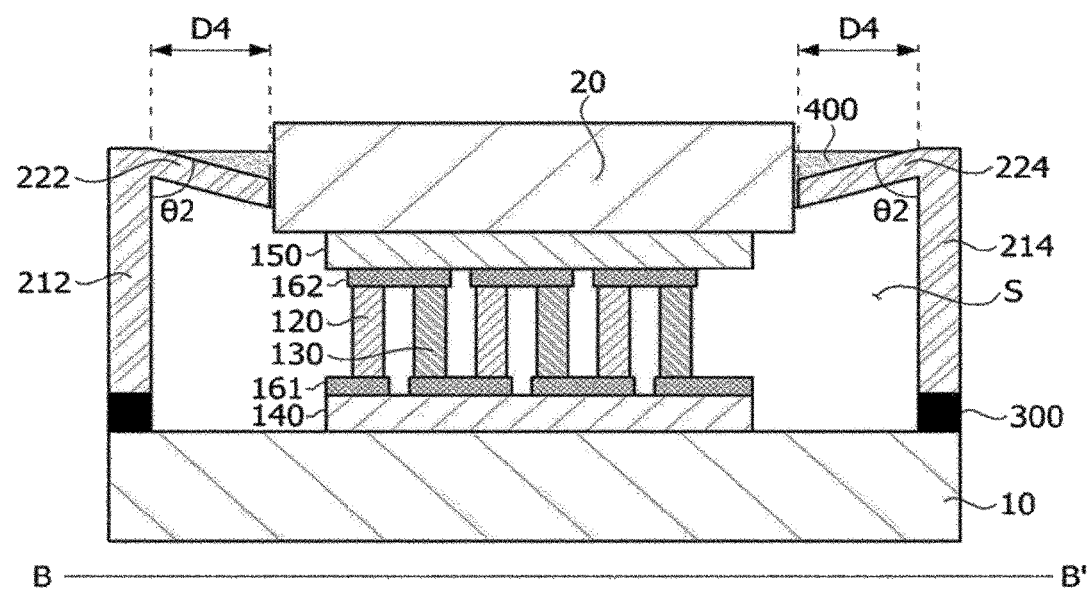

[FIG.5]
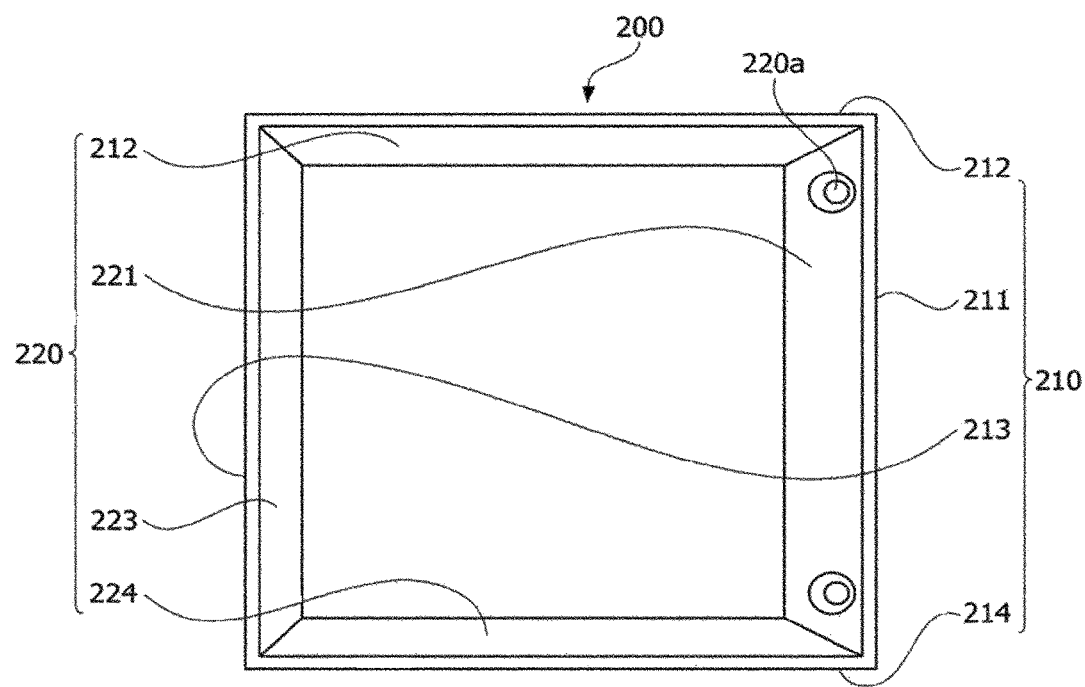

[FIG.6]
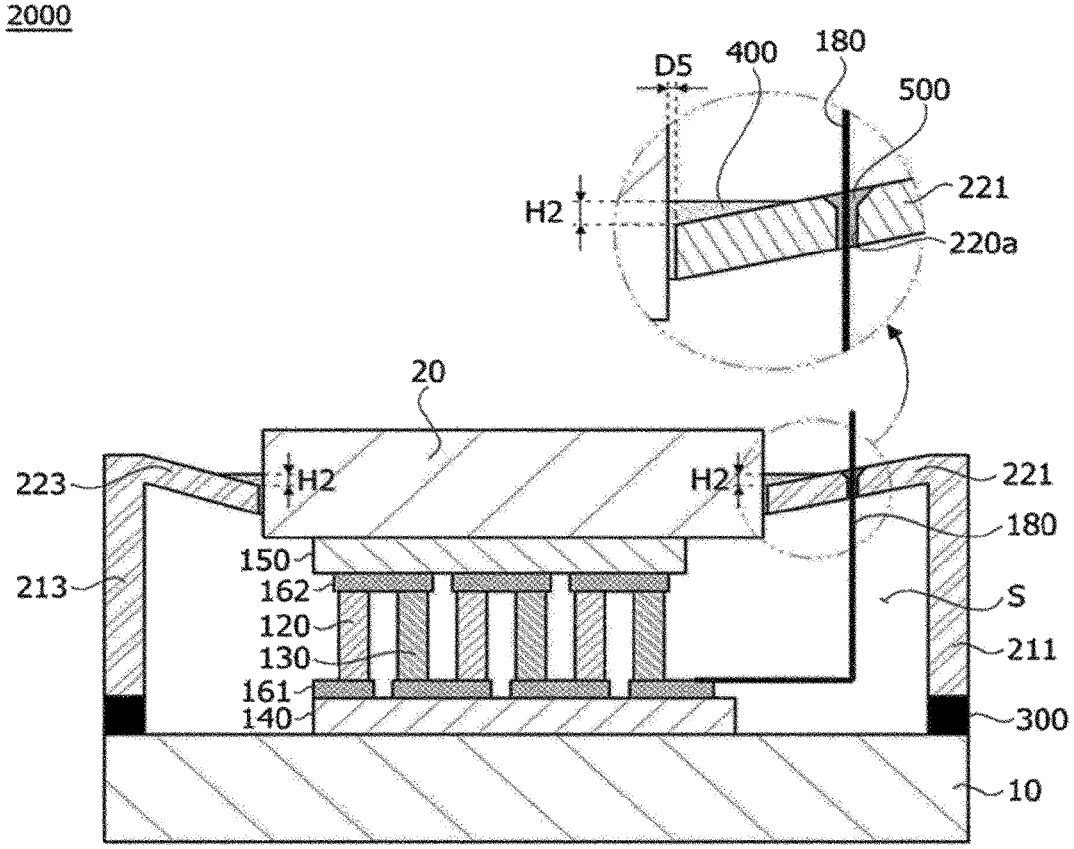

[FIG.7]
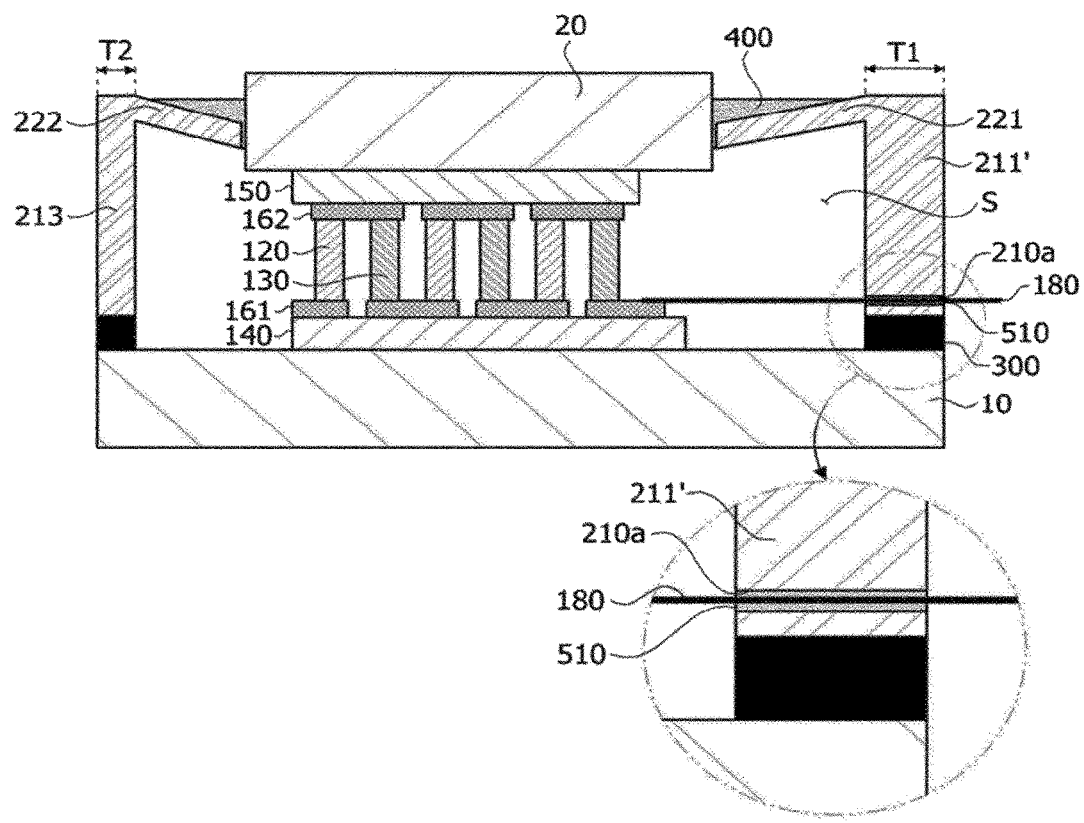

[FIG.8A]
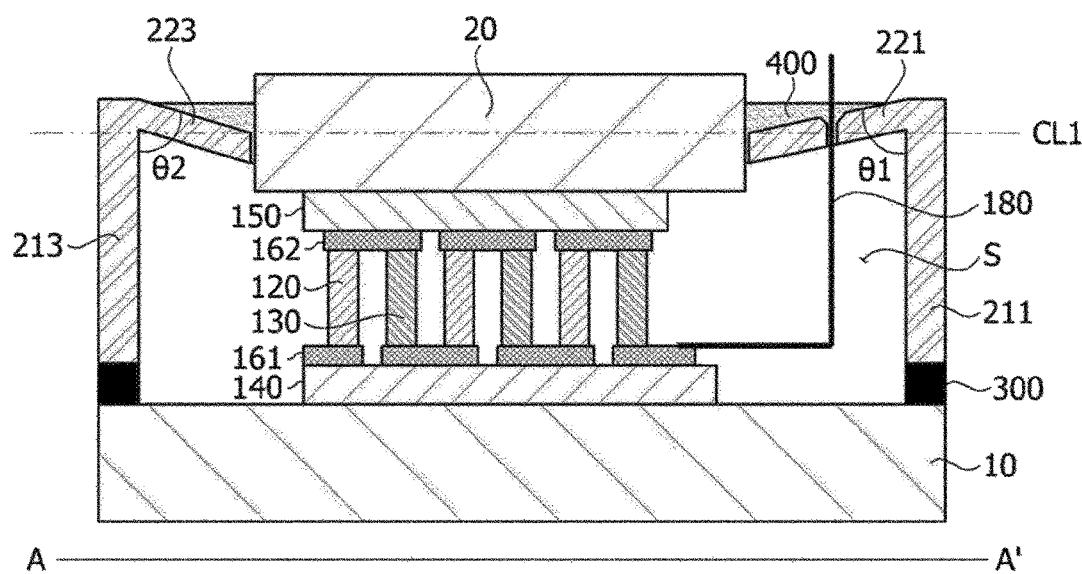

[FIG.8B]
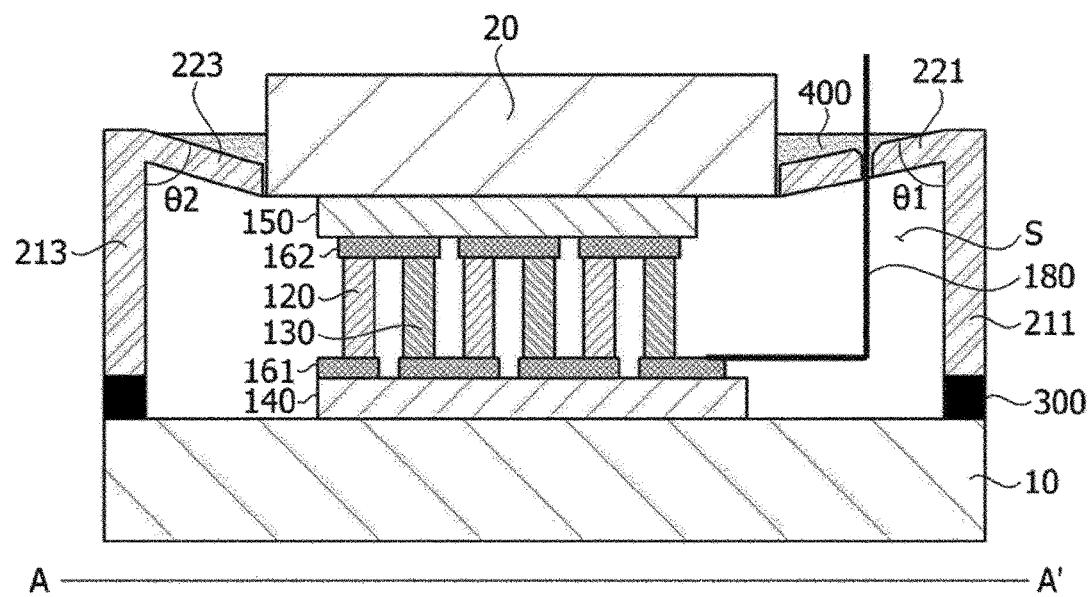

[FIG.8C]
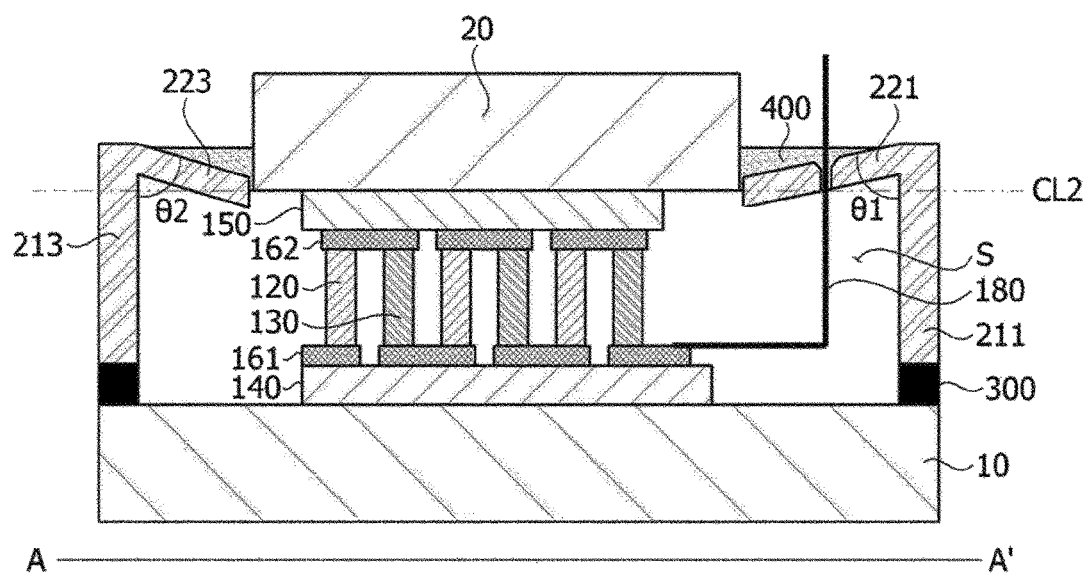

[FIG.9]
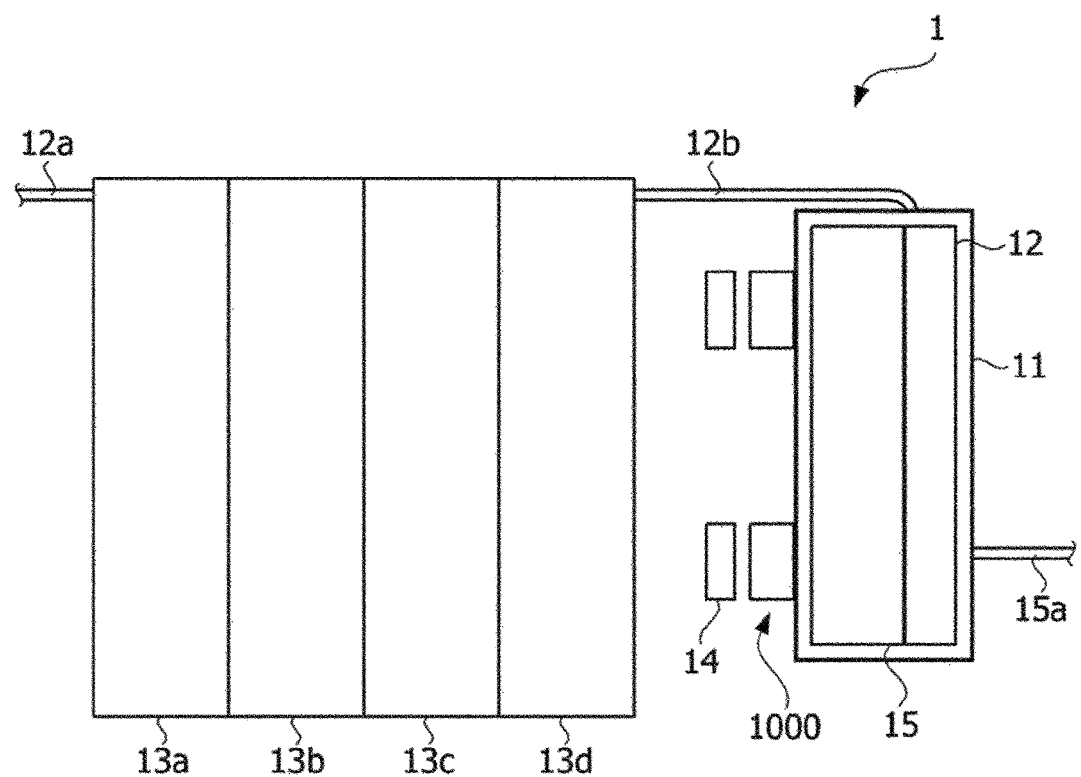

[FIG.10]
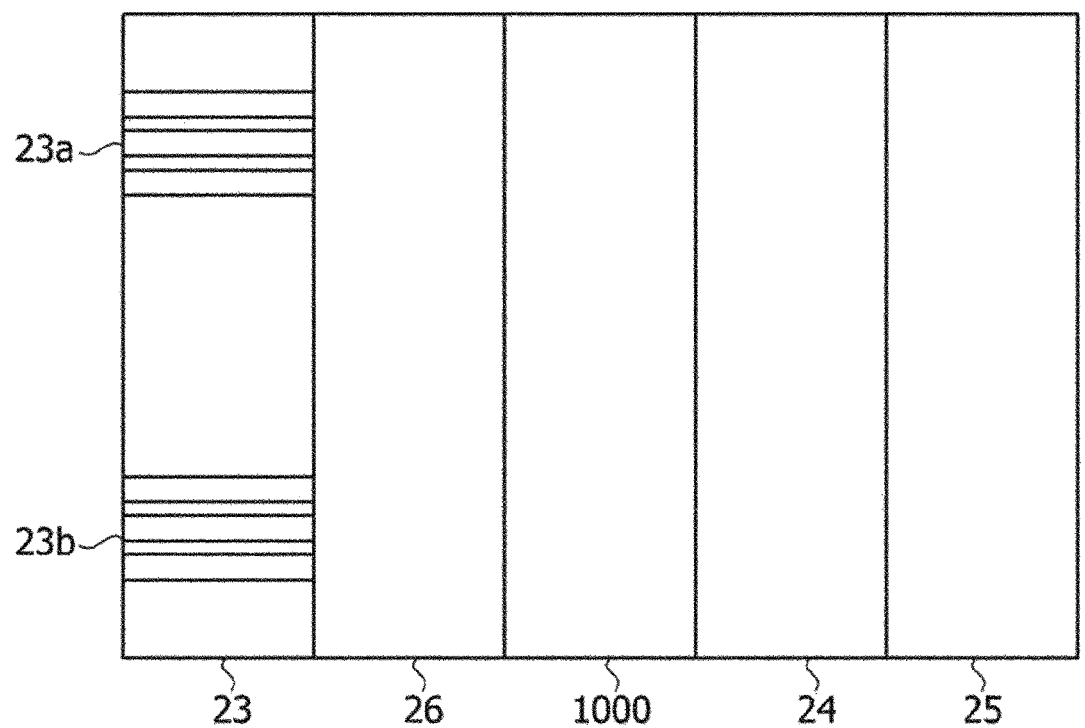

[FIG.11A]
[FIG.11B]
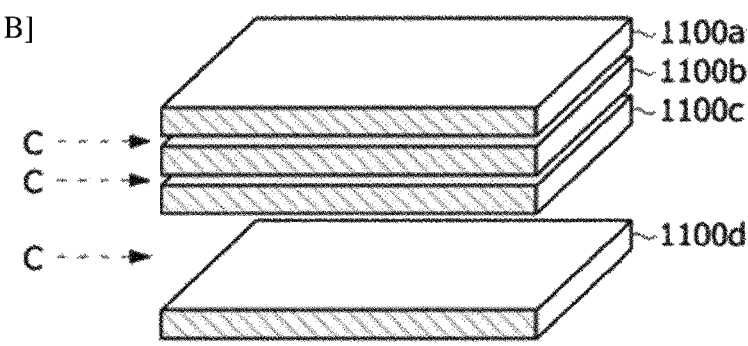
[FIG.11C]
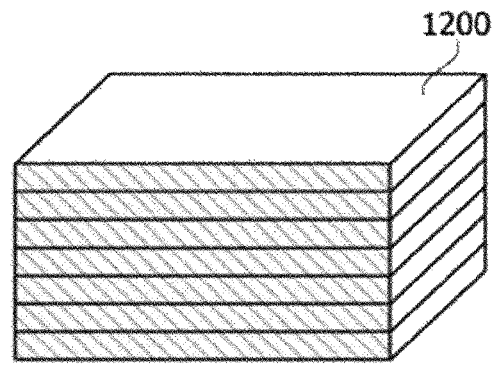
[FIG.11D]
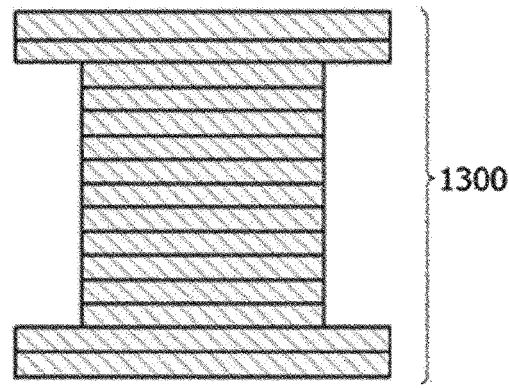

[FIG.12A]
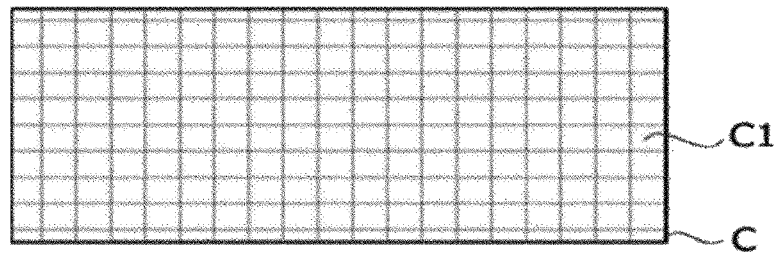
[FIG.12B]
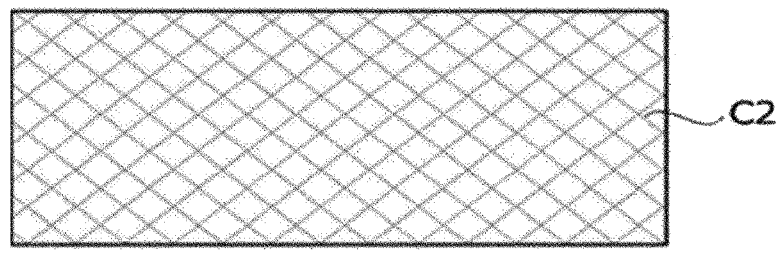
[FIG.12C]
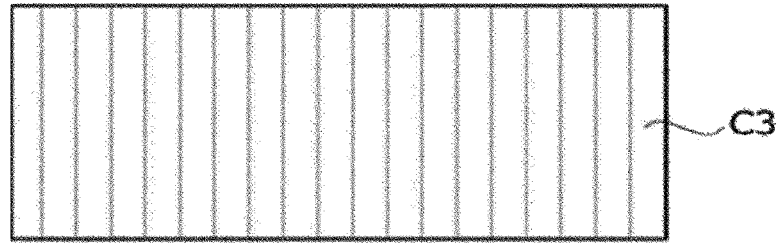
[FIG.12D]
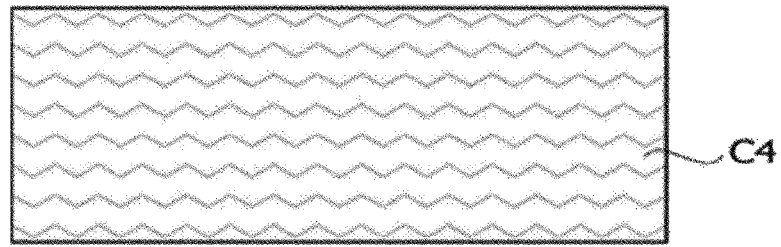

[FIG.13A]
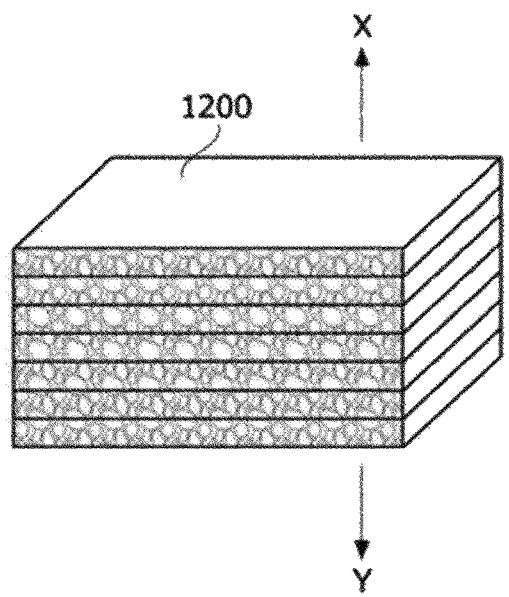
[FIG. 13B]
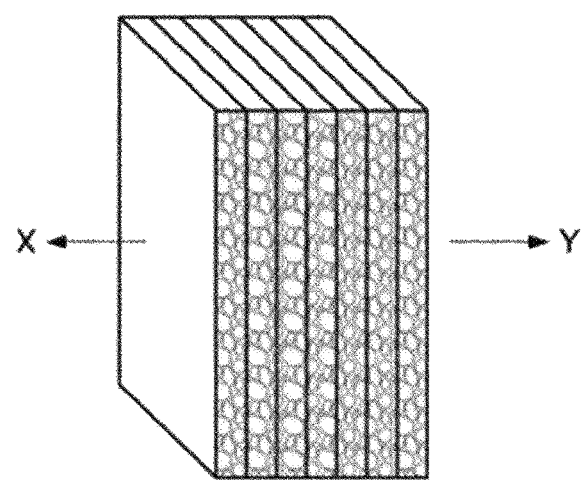
[FIG.13C]
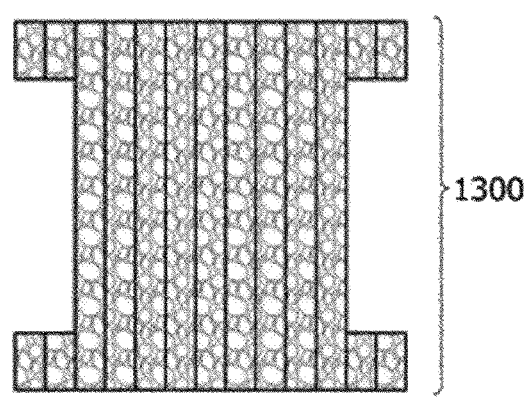

THERMOELECTRIC MODULE

CROSS-REFERENCE TO RELATED PATENT APPLICATIONS

This application is a U.S. National Stage Application under 35 U.S.C. § 371 of PCT Application No. PCT/KR2018/014165, filed Nov. 19, 2018, which claims priority to Korean Patent Application Nos. 10-2017-0167652, filed Dec. 7, 2017 and 10-2018-0141828, filed Nov. 16, 2018, whose entire disclosures are hereby incorporated by reference.

TECHNICAL FIELD

The present invention relates to a thermoelectric module, and more particularly, to a thermoelectric module with improved heat flow performance therein.

BACKGROUND ART

A thermoelectric effect is a phenomenon caused due to movements of electrons and holes in a material and means direct energy conversion between heat and electricity.

A thermoelectric element is a generic term for a device which uses a thermoelectric effect and has a structure in which a P-type thermoelectric material and an N-type thermoelectric material are disposed between metal electrodes and bonded to form a pair of PN junctions.

The thermoelectric element may be classified into an element using a temperature variation in electrical resistance, an element using the Seebeck effect in which an electromotive force is generated due to a temperature difference, and an element using the Peltier effect which is a phenomenon in which heat absorption or heat radiation occurs due to a current and the like.

Thermoelectric elements are widely applied to household appliances, electronic parts, and communication parts. For example, the thermoelectric elements may be applied to cooling devices, heating devices, power generation devices, and the like. Accordingly, the demand for thermoelectric performance of the thermoelectric elements is gradually increasing.

The thermoelectric modules can be applied to refrigerators or water purifiers when used for cooling, but there is a problem in that the thermoelectric elements are corroded by condensation and moisture due to low temperature implementation. In order to solve the above problem, in the related art, a sealing material is directly disposed on a side surface of a thermoelectric element to prevent moisture infiltration. However, since the sealing material is directly bonded to the thermoelectric element, there is a problem in that heat flow performance is degraded in the thermoelectric module.

DISCLOSURE

Technical Problem

The present invention is directed to providing a thermoelectric module with improved heat flow performance therein by securing a heat flow space in a side surface of the thermoelectric element.

Problems to be solved in the embodiments are not limited to the above-described problems, and objects and effects which can be determined from the solutions and the embodiments of the problems described below are also included.

Technical Solution

One aspect of the present invention provides a thermoelectric module including a first thermally conductive plate; a thermoelectric element disposed on the first thermally conductive plate; a second thermally conductive plate disposed on the thermoelectric element; and a cover frame disposed on the first thermally conductive plate and configured to form an accommodation space to accommodate the thermoelectric element in the accommodation space, wherein the thermoelectric element includes a first substrate; a plurality of thermoelectric legs disposed on the first substrate; a second substrate disposed on the plurality of thermoelectric legs; and electrodes including a plurality of first electrodes disposed between the first substrate and the plurality of thermoelectric legs and a plurality of second electrodes disposed between the second substrate and the plurality of thermoelectric legs, and wherein the cover frame includes an outer frame disposed to be spaced apart from the thermoelectric element on the first thermally conductive plate, and an upper frame extending to the second thermally conductive plate to be inclined downward from an upper end of the outer frame.

An angle between the outer frame and a top surface of the upper frame may be an acute angle.

The thermoelectric module may further include a first sealing member disposed between the outer frame and the first thermally conductive plate, and a second sealing member disposed between the upper frame and the second thermally conductive plate.

The upper frame may be separated from the second thermally conductive plate, and the second sealing member may be disposed between the side surface of the upper frame and the side surface of the second thermally conductive plate.

The second sealing member may be disposed between a top surface of the upper frame and the side surface of the second thermally conductive plate.

The thermoelectric module may further include lead lines including a first lead line electrically connected to at least one among the plurality of first electrodes and a second lead line electrically connected to at least one among the plurality of second electrodes, and the lead line may pass through a through-hole of the outer frame or a through-hole of the upper frame.

The second thermally conductive plate may include a first side surface, a second side surface, a third side surface and a fourth side surface, the upper frame may include a first upper frame corresponding to the first side surface of the second thermally conductive plate, a second upper frame corresponding to the second side surface of the second thermally conductive plate, a third upper frame corresponding to the third side surface of the second thermally conductive plate, and a fourth upper frame corresponding to the fourth side surface of the second thermally conductive plate, and a length of the first upper frame may be greater than that of each of the second upper frame, the third upper frame, and the fourth upper frame.

The through-hole of the upper frame may be disposed in the first upper frame.

A first angle between the outer frame and a top surface of the first upper frame may be greater than a second angle between the outer frame and a top surface of each of the second upper frame, the third upper frame, and the fourth upper frame.

The first substrate may include a first side surface, a second side surface, a third side surface, and a fourth side surface, the outer frame may include a first outer frame corresponding to the first side surface of the first substrate, a second outer frame corresponding to the second side surface of the first substrate, a third outer frame corresponding to the third side surface of the first substrate, and a fourth outer frame corresponding to the fourth side surface of the first substrate, and a thickness of the first outer frame may be greater than that of each of the second outer frame, the third outer frame, and the fourth outer frame.

The through-hole of the outer frame may be disposed in the first outer frame.

The thermoelectric module may further include a third sealing member disposed between the through-hole and the lead line.

A center of the side surface of the second thermally conductive plate may be disposed to be collinear with a corner formed by the top surface and the side surface of the upper frame in a height direction.

A corner formed by a bottom surface and the side surface of the second thermally conductive plate may be disposed to be collinear with a corner at which a bottom surface and the side surface of the upper frame meet.

A corner formed by the top surface and the side surface of the upper frame may be disposed below a center of the side surface of the second thermally conductive plate in the height direction.

A corner formed by the bottom surface and the side surface of the second thermally conductive plate may be disposed to be collinear with a center of the side surface of the upper frame in the height direction.

A corner formed by the top surface and the side surface of the upper frame may be disposed below a center of the side surface of the second thermally conductive plate in the height direction.

An area of the first thermally conductive plate may be larger than that of the second thermally conductive plate, the first thermally conductive plate may be disposed at a hot side of the thermoelectric element, and the second thermally conductive plate may be disposed at a cold side of the thermoelectric element.

Advantageous Effects

In accordance with embodiments of the present invention, a thermoelectric element with excellent waterproof performance and excellent dust-proof performance can be provided. In particular, in accordance with the embodiments of the present invention, a thermoelectric element with improved heat flow performance can be provided.

Various beneficial advantages and effects of the present invention are not limited by the detailed description and should be easily understood through a description of a detailed embodiment of the present invention.

DESCRIPTION OF DRAWINGS

FIG. 1 is a top view illustrating a thermoelectric module according to one embodiment of the present invention.

FIG. 2A is a perspective view illustrating the thermoelectric module according to one embodiment of the present invention.

FIG. 2B is a perspective view illustrating a thermoelectric element according to one embodiment of the present invention.

FIG. 3 is a cross-sectional view taken along line A-A' of FIG. 1.

FIG. 4 is a cross-sectional view taken along line B-B' of FIG. 1.

FIG. 5 is a top view illustrating a cover frame in FIG. 1.

FIG. 6 is a cross-sectional view illustrating a thermoelectric module according to another embodiment of the present invention.

FIG. 7 is a cross-sectional view illustrating a thermoelectric module according to still another embodiment of the present invention.

FIGS. 8A to 8C are cross-sectional views illustrating a thermoelectric module according to yet another embodiment of the present invention.

FIG. 9 is a diagram illustrating an example in which the thermoelectric element according to the present invention is applied to a water purifier.

FIG. 10 is a diagram illustrating an example in which the thermoelectric element according to the present invention is applied to a refrigerator.

FIGS. 11A to 13C are diagrams illustrating an example of a thermoelectric leg of the thermoelectric element according to another embodiment of the present invention.

MODES OF THE INVENTION

The present invention may be modified into various forms and may have a variety of embodiments, and, therefore, specific embodiments will be illustrated in the accompanying drawings and described. The embodiments, however, are not to be taken in a sense which limits the present invention to the specific embodiments, and should be construed to include modifications, equivalents, or substitutes within the spirit and technical scope of the present invention.

Also, terms including ordinal numbers such as first, second, and the like used herein may be used to describe various components, but the various components are not limited by these terms. The terms are used only for the purpose of distinguishing one component from another component. For example, without departing from the scope of the present invention, a second component may be referred to as a first component, and similarly, a first component may also be referred to as a second component. The term "and/or" includes a combination of a plurality of related listed items and any one item of the plurality of related listed items.

When a component is referred to as being "connected," or "coupled" to another component, it may be directly connected or coupled to another component, but it should be understood that still another component may exist between the component and another component. On the contrary, when a component is referred to as being "directly connected," or "directly coupled" to another, it should be understood that still another component may not be present between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary should be construed as having meanings that are consistent in the context of the relevant art and are not to be interpreted as having an idealistic or excessively formalistic meaning unless clearly defined in the present application.

Hereinafter, embodiments of the present invention will be described in detail with reference to the accompanying drawings, the same reference numerals are given to the same or corresponding components regardless of a number of the drawing, and a duplicate description thereof will be omitted.

FIG. 1 is a top view illustrating a thermoelectric module according to one embodiment of the present invention, FIG. 2 is a perspective view illustrating a thermoelectric element according to one embodiment of the present invention, FIG. 3 is a cross-sectional view taken along line A-A' of FIG. 1, FIG. 4 is a cross-sectional view taken along line B-B' of FIG. 1, and FIG. 5 is a top view illustrating a cover frame in FIG. 1.

Hereinafter, a thermoelectric module 100 according to one embodiment of the present invention will be described with reference to FIGS. 1 to 5.

Referring to FIGS. 1 to 5, the thermoelectric module 100 according to one embodiment of the present invention includes a first thermally conductive plate 10, a second thermally conductive plate 20, a thermoelectric element 100, a cover frame 200, a first sealing member 300, and a second sealing member 400.

The first thermally conductive plate 10 and the second thermally conductive plate 20 are opposite to each other by interposing a thermoelectric element 100 therebetween. The first thermally conductive plate 10 and the second thermally conductive plate 20 may each be made of a metal material having excellent thermal conductivity. For example, each of the first thermally conductive plate 10 and the second thermally conductive plate 20 may be a plate made of at least one among aluminum (Al), an Al alloy, copper (Cu), and a Cu alloy.

Here, as shown in the drawings, an area of the first thermally conductive plate 10 may be larger than that of the second thermally conductive plate 20. In this case, the area of the first thermally conductive plate 10 may be 1.2 to 5 times the area of the second thermally conductive plate 20. Here, the first thermally conductive plate 10 may be disposed on a heat radiation surface of the thermoelectric element 100, that is, at a hot side thereof, and the second thermally conductive plate 10 may be disposed on a heat absorption surface of the thermoelectric element 100, that is, at a cold side thereof. Since the first thermally conductive plate 10 is installed between the heat radiation surface of the thermoelectric element 100 and a surface of a heating part (not shown), heat generated from the heating part (not shown) may be conducted to the first thermally conductive plate 10. When the area of the first thermally conductive plate 10 is larger than that of the second thermally conductive plate 20, a contact area between the heating part (not shown) and the first thermally conductive plate 10 increases so that a transfer efficiency of the heat, which is generated from the heating part (not shown), to the heat radiation surface of the thermoelectric element 100 through the first thermally conductive plate 10 may be increased.

When the first thermally conductive plate 10 is used, the first thermally conductive plate 10 may increase a heat transfer area to reduce a temperature gradient. Most of all, a gap between the heating part (not shown) and the second thermally conductive plate 20 bonded in a direction of the heat absorption surface of the thermoelectric element 100 is intentionally widened so that a difference in temperature between the hot side and the cold side may be increased.

Although not shown in the drawings, when a fan unit is further disposed to be spaced apart from the second thermally conductive plate 20, a difference in temperature between the hot side and the cold side may be further increased.

In this specification, although a thickness of the first thermally conductive plate 10 has been illustrated as being equal to that of the second thermally conductive plate 20, the present invention is not limited thereto. The thickness of the first thermally conductive plate 10 may be larger than that of the second thermally conductive plate 20, or the thickness of the second thermally conductive plate 20 may be larger than that of the first thermally conductive plate 10. For example, a ratio A1/A2 of the thickness A1 of the first thermally conductive plate 10 to a thickness A2 of the second thermally conductive plate 20 may range 0.4 to 5, preferably 0.5 to 5, and more preferably 1.25 to 5.

Table 1 shows results of measuring power consumption of the thermoelectric element 100 when the first thermally conductive plate 10 is disposed at the hot side of the thermoelectric element 100, and the second thermally conductive plate 20 having an area that is smaller than that of the first thermally conductive plate 10 is disposed at the cold side of the thermoelectric element 100. Here, a width*height of the first thermally conductive plate 10 was 75 mm*69 mm, and a width*height of the second thermally conductive plate 20 was set to 55 mm*55 mm.

TABLE 1

| | | | | | |
|---|---|---|---|---|---|
| Thickness (T) of first thermally conductive plate 10 | | 2 | | 5 | |
| Thickness (T) of second thermally conductive plate 20 | 2 | 4 | 5 | 1 | 4 |
| Power consumption (kWh/month) | 80.2 | 80.3 | 80.4 | 74.3 | 73.2 |

Referring to Table 1, in a condition in which an area of the first thermally conductive plate 10 was larger than that of the second thermally conductive plate 20, when the ratio A1/A2 of the thickness A1 of the first thermally conductive plate 10 to the thickness A2 of the second thermally conductive plate 20 was in the range of 0.4 to 5, it can be seen that power consumption exhibited 81 kWh/month or less. In addition, for example, in a condition in which the thickness of the first thermally conductive plate 10 was larger than that of the second thermally conductive plate 20, when the ratio A1/A2 of the thickness A1 of the first thermally conductive plate 10 to the thickness A2 of the second thermally conductive plate 20 was in the range of 1.25 to 5, it can be seen that the power consumption exhibited 75 kWh/month or less. Further, when the thickness of the first thermally conductive plate 10 was equal to that of the second thermally conductive plate 20 or the thickness of the first thermally conductive plate 10 was smaller than that of the second thermally conductive plate 20, it can be seen that, even when the thickness of the second thermally conductive plate 20 was increased, the power consumption is kept constant.

Here, although the first thermally conductive plate 10 has been described as being set as the heat radiation surface and the second thermally conductive plate 20 has been described as being as the heat absorption surface, the heat absorption surface and the hear radiation surface may be interchanged according to a direction of a current applied to the thermoelectric element.

In addition, referring to FIG. 2B, the thermoelectric element 100 includes a P-type thermoelectric leg 120, an N-type thermoelectric leg 130, a lower substrate 140, an upper substrate 150, a lower electrode 161, an upper electrode 162, and a solder layer (not shown).

The lower electrode 161 is disposed between the lower substrate 140 and lower bottom surfaces of the P-type thermoelectric leg 120 and the N-type thermoelectric leg 130, and the upper electrode 162 is disposed between the upper substrate 150 and upper bottom surfaces of the P-type thermoelectric leg 120 and the N-type thermoelectric leg 130. Accordingly, a plurality of P-type thermoelectric legs 120 and a plurality of N-type thermoelectric legs 130 are electrically connected by the lower electrode 161 and the upper electrode 162. A pair of the P-type thermoelectric leg 120 and the N-type thermoelectric leg 130, which are disposed between the lower electrode 161 and the upper electrode 162 and electrically connected to each other, may form a unit cell.

For example, when voltages are applied to the lower electrode 161 and the upper electrode 162 through lead lines 181 and 182, a substrate in which a current flows from the P-type thermoelectric leg 120 to the N-type thermoelectric leg 130 due to the Peltier effect may absorb heat to serve as a heat absorption part, and a substrate in which a current flows from the N-type thermoelectric leg 130 to the P-type thermoelectric leg 120 may be heated to serve as a heat radiation part.

Here, each of the P-type thermoelectric leg 120 and the N-type thermoelectric leg 130 may be a bismuth telluride (Bi—Te)-based thermoelectric leg containing Bi and Te as main raw materials. The P-type thermoelectric leg 120 at 100 wt % may be a thermoelectric leg which includes 99 to 99.999 wt % Bi—Te-based main low material containing at least one among antimony (Sb), nickel (Ni), Al, Cu, silver (Ag), lead (Pb), boron (B), gallium (Ga), Te, Bi, and indium (In) and includes 0.001 to 1 wt % mixture containing Bi or Te. For example, the P-type thermoelectric leg 120 at 100 wt % may include Bi—Se—Te as the main raw material and may further include 0.001 to 1 wt % Bi or Te. The N-type thermoelectric leg 230 at 100 wt % may be a thermoelectric leg which includes 99 to 99.999 wt % Bi—Te-based low material containing at least one among selenium (Se), Ni, Al, Cu, Ag, Pb, B, Ga, Te, Bi, and In and includes 0.001 to 1 wt % mixture containing Bi or Te. For example, the N-type thermoelectric leg 130 at 100 wt % may include Bi—Sb—Te as the main raw material and may further include 0.001 to 1 wt % Bi or Te.

Each of the P-type thermoelectric leg 120 and the N-type thermoelectric leg 130 may be formed in a bulk shape or a stacked shape. Generally, a bulk-shaped P-type thermoelectric leg 120 or a bulk-shaped N-type thermoelectric leg 130 may be obtained by heat-treating a thermoelectric material to produce an ingot, crushing and sieving the ingot to obtain a thermoelectric leg powder, sintering the thermoelectric leg powder, and cutting the sintered body. A stack-shaped P-type thermoelectric leg 120 or a stack-shaped N-type thermoelectric leg 230 may be obtained by applying a paste containing a thermoelectric material on sheet-shaped substrates to form unit members, stacking the unit members, and cutting the stacked unit members.

In this case, the pair of the P-type thermoelectric leg 120 and the N-type thermoelectric leg 130 may have the same shape and height or may have different shapes and volumes. For example, since electrical conductivity characteristics of the P-type thermoelectric leg 120 and the N-type thermoelectric leg 130 are different, a cross-sectional area of the N-type thermoelectric leg 130 may be formed differently from that of the P-type thermoelectric leg 120.

Meanwhile, insulators (not shown) may be disposed on side surfaces of the P-type thermoelectric leg 120 and the N-type thermoelectric leg 130 in a height direction (Z-axis direction).

Meanwhile, performance of a thermoelectric element according to one embodiment of the present invention may be expressed by a Seebeck index. A Seebeck index ZT may be expressed by Equation 1.

$$ZT=\alpha^2\sigma T/k \qquad \text{[Equation 1]}$$

Here, α is a Seebeck coefficient (V/K), σ is electrical conductivity (S/m), and α2σ is a power factor (W/mK2). Further, T is a temperature, and k is thermal conductivity (W/mK). k may be expressed as a·cp·p, a is thermal diffusivity (cm2/S), cp is a specific heat (J/gK), and ρ is a density (g/cm3).

In order to obtain a Seebeck coefficient of a thermoelectric element, a Z value (V/K) is measured using a Z-meter, and a Seebeck index ZT may be calculated using the measured Z value.

Here, the lower electrode 120 disposed between the lower substrate 140, the P-type thermoelectric leg 120, and the N-type thermoelectric leg 130, and the upper electrode 162 disposed between the upper substrate 150, the P-type thermoelectric leg 120, and the N-type thermoelectric leg 130 may each include at least one among Cu, Ag, and Ni.

In addition, the lower substrate 140 and the upper substrate 150 opposite to each other may be insulating substrates or metal substrates. The insulating substrate may be an alumina substrate or a polymer resin substrate having flexibility. The polymer resin substrate having flexibility may include various insulating resin materials such as high permeability plastic and the like such as polyimide (PI), polystyrene (PS), polymethyl methacrylate (PMMA), cyclic olefin copoly (COC), polyethylene terephthalate (PET), and a resin. Alternatively, the insulating substrate may be a fabric. The metal substrate may include Cu, a Cu alloy, or a Cu—Al alloy. In addition, when the lower substrate 140 and the upper substrate 150 are metal substrates, a dielectric layer may further be formed between the lower substrate 240 and the lower electrode 161 and between the upper substrate 150 and the upper electrode 162. The dielectric layer may include a material having thermal conductivity ranging from 5 W/K to 10 W/K.

In this case, sizes of the lower substrate 140 and the upper substrate 150 may be formed to be different from each other. For example, a volume, a thickness, or an area of one among the lower substrate 140 and the upper substrate 150 may be formed to be larger than that of the other one thereamong. Consequently, heat absorption performance or heat radiation performance of the thermoelectric element may be improved.

Meanwhile, as shown in FIG. 2, the lower substrate 140 may be formed to have a first length D1 in a first direction, and the upper substrate 150 may be formed to have a second length D2 in the first direction.

Here, since the first length D1 is formed to be larger than the second length D2, the lead lines 181 and 182 are easily connected to the lower electrode 261 formed on a distal end of the lower substrate 140 in the first direction.

Here, an electrical connection between the lower electrode 261 and the lead lines 181 and 182 may be implemented by at least one among various methods such as a welding method, a mechanical engagement method, and the like.

A plurality of lower electrodes 161 and a plurality of upper electrodes 162 electrically connect P-type thermoelectric legs 120 and N-type thermoelectric legs 130 using electrode materials such as Cu, Ag, or Ni. A thickness of each of the lower electrode 161 and the upper electrode 162 may be formed in the range of 0.01 mm to 0.3 mm. More preferably, the thickness of each of the lower electrode 161 and the upper electrode 162 may be implemented in the range of 10 μm to 20 μm.

In addition, the plurality of lower electrodes 161 and the plurality of upper electrodes 162 may each be disposed in the form of an m*n array (here, each of m and n may be an integer of 1 or more, and m and n may be the same or different from each other), but the present invention is not limited thereto. The lower electrode 161 and the upper electrode 162 may each be disposed to be spaced apart from another lower electrode 161 and another upper electrode 162 adjacent thereto. For example, the lower electrode 161 and the upper electrode 162 may be disposed to be spaced approximately 0.5 mm to 0.8 mm from other lower and upper electrodes 161 and 162 adjacent thereto.

In addition, a pair of the P-type thermoelectric leg 120 and the N-type thermoelectric leg 130 is disposed on the lower electrode 161, and the pair of the P-type thermoelectric leg 120 and the N-type thermoelectric leg 130 is disposed below the upper electrode 162.

That is, a bottom surface of the P-type thermoelectric leg 120 may be disposed on the lower electrode 161 and a top surface thereof may be disposed on the upper electrode 162, and a bottom surface of the N-type thermoelectric leg 130 may be disposed on the lower electrode 161 and a top surface thereof may be disposed on the upper electrode 162. When the P-type thermoelectric leg 120 of the pair of the P-type thermoelectric leg 120 and the N-type thermoelectric leg 130 which are disposed on the lower electrode 161 is disposed on one lower electrode 161 among the plurality of lower electrodes 162, the N-type thermoelectric leg 130 may be disposed on another lower electrode 162 adjacent to the one lower electrode 161. Accordingly, the plurality of P-type thermoelectric legs 120 and the plurality of N-type thermoelectric legs 130 are electrically connected in series through the lower electrodes 161 and the lower electrodes 162.

In this case, a pair of lower solder layers (not shown) may be applied on the lower electrode 161 to bond the pair of the P-type thermoelectric leg 120 and the N-type thermoelectric leg 130, and the pair of the P-type thermoelectric leg 120 and the N-type thermoelectric leg 130 may be disposed on the pair of lower solder layers.

In this case, a pair of upper solder layers (not shown) may be applied on a lower portion of the upper electrode 162 to bond the pair of the P-type thermoelectric leg 120 and the N-type thermoelectric leg 130, and the pair of the P-type thermoelectric leg 120 and the N-type thermoelectric leg 130 may be disposed below the pair of upper solder layers 172.

The cover frame 200 forms an accommodation space S on the first thermally conductive plate 10, and the thermoelectric element 100 may be accommodated inside the accommodation space S. Here, the accommodation space S may be formed in the range of 1.1 to five times a volume of the thermoelectric element 100. More preferably, the accommodation space S may be implemented in the range of two to three times the volume of the thermoelectric element 100.

When the accommodation space S of the cover frame 200 is 1.1 times or less the volume of the thermoelectric element 100, since a heat flow space is not secured in a side surface of the thermoelectric element 100, it is not expected to improve heat flow performance. When the accommodation space S of the cover frame 200 is five times or more the volume of the thermoelectric element 100, there is a problem of increasing the volume of the thermoelectric module 1000 without expecting improvement in the heat flow performance due to expansion of the accommodation space S.

That is, the thermoelectric module 1000 according to one embodiment of the present invention may expand a heat flow, which is generated due to a difference in temperature between the lower substrate 140 and the upper substrate 150 of the thermoelectric element 100, to a side portion of the thermoelectric element 100 so that reliability may be secured even when heat flows.

The cover frame 200 may be made of an insulating synthetic resin insulator having low thermal conductivity and maintaining structural rigidity and may include an outer frame 210 and an upper frame 220.

The outer frame 210 has a quadrangular column shape according to a shape of the thermoelectric element 100 and includes a first outer frame 211, a second outer frame 211, a third outer frame 213, and a fourth outer frame 214.

Here, the first outer frame 211 corresponds to face a first side surface of the lower substrate 140, the second outer frame 212 corresponds to face a second side surface of the lower substrate 140, the third outer frame 213 corresponds to face a third side surface of the lower substrate 140, and the fourth outer frame 214 corresponds to face a fourth side surface of the lower substrate 140.

The first outer frame 211, the second outer frame 211, the third outer frame 213, and the fourth outer frame 214 are vertically disposed substantially perpendicular to a top surface of the first thermally conductive plate 10.

Here, the first outer frame 211, the second outer frame 211, the third outer frame 213, and the fourth outer frame 214 are disposed to be spaced apart from the thermoelectric element 100, thereby forming a separation space between the outer frame 210 and the thermoelectric element 100.

Meanwhile, the first sealing member 300 is disposed between the first thermally conductive plate 10 and a bottom surface of the outer frame 210 pressed against the first thermally conductive plate 10 to seal the cover frame 200, thereby preventing moisture from infiltrating into an interior of the cover frame 200.

Here, the first sealing member 300 may be made of waterproof tape, waterproof silicone, a rubber or resin material, or adhesive, and preferably, the first sealing member 300 may be made of the waterproof tape in order for adhesion and sealing between the first thermally conductive plate 10 and the outer frame 210 and in order for convenience in work.

The upper frame 220 extends from an upper end of the outer frame 210 to the second thermally conductive plate 20, and a top surface or both of the top surface and a bottom surface of the upper frame 220 have an inclined surface which is inclined at a predetermined angle in a downward direction. That is, an angle between the top surface of the upper frame 220 and the outer frame 210 is formed as an acute angle.

Here, the angle between the top surface of the upper frame 220 and the outer frame 210 may be set in the range of 10 degrees to 80 degrees, preferably in the range of 20 degrees to 70 degrees, and more preferably in the range of 30 degrees to 60 degrees. Accordingly, a volume and a shape of the accommodation space S may be determined, and, although not sufficient, a heat exchange path between the first thermally conductive plate 10 and the second thermally conductive plate 20 through the upper frame 220 and the outer frame 210 may be efficiently controlled. The upper frame 220 includes a first upper frame 221, a second upper frame 221, a third upper frame 223, and a fourth upper frame 224, which extend from the first outer frame 211, the second outer frame 211, the third outer frame 213, and the fourth outer frame 214.

Here, the upper frame 220 corresponds to face a first side surface of the second thermally conductive plate 20, the second outer frame 212 corresponds to face a second side surface of the second thermally conductive plate 20, the third outer frame 213 corresponds to face a third side surface of the second thermally conductive plate 20, and the fourth outer frame 214 corresponds to face a fourth side surface of the second thermally conductive plate 20.

Meanwhile, as described above, as compared with the upper substrate 150, the first side surface of the lower substrate 140 further extends, and the lead lines 181 and 182 may be connected to the lower electrode 161 on the extending first side surface. In this case, a through-hole 220a may be formed in the first upper frame 221 formed at a first side position at which the lead lines 181 and 182 are disposed, and the lead lines 181 and 182 may pass through the through-hole 220a to be exposed to the outside of the cover frame 200.

Meanwhile, the first upper frame 221 in which the through-hole 220a is formed has a third length D3 for securing a region and a structural rigidity of the through-hole 220a, and the third length D3 may be formed to be longer than a fourth length D4 of each of the second upper frame 221, third upper frame 223, and fourth upper frame 224.

In addition, inner end portions facing each other in the upper frame 220 should be formed at the same height. Since the third length D3 of the first upper frame 221 is longer than the fourth length D4 of each of the upper frames 222, 223, and 224 of other side surfaces, a first angle θ1 between the top surface of the first upper frame 221 and the first outer frame 211 may be formed to be greater than a second angle θ2 between upper surfaces of the upper frame 222, 223, and 224 of other side surfaces and the outer frames 212, 213, and 214 of other side surfaces.

Meanwhile, the upper frame 220 may be spaced a separation distance D5 from the side surface of the second thermally conductive plate 20.

In addition, the second sealing member 400 may be disposed between the upper frame 220 and the second thermally conductive plate 20.

The second sealing member 400 may be formed of waterproof tape, waterproof silicone, an adhesive made of a rubber or resin material, or the like. It is preferable to implement the second sealing member 400 with waterproof silicone or the like which is capable of, before curing, flowing along the top surface (the inclined surface) of the upper frame 220 to be introduced into a separation gap between the upper frame 220 and the second thermally conductive plate 20.

Here, the separation distance D5 between the upper frame 220 and the side surface of the second thermally conductive plate 20 may be set in the range of 0.1 mm to 0.5 mm according to viscosity of the second sealing member 400 before curing. When the separation distance D5 is less than or equal to 0.1 mm, since the second sealing member 400 is not introduced, waterproof performance between the upper frame 220 and the second thermally conductive plate 20 is not reliable, whereas, when the separation distance D5 is greater than or equal to 0.5 mm, there is a problem in that the second sealing member 400 should be introduced more than necessary so as to seal between the upper frame 220 and the second thermally conductive plate 20.

Meanwhile, in one embodiment of the present invention, after curing, the second sealing member 400 has a first height H1 at an end portion of the upper frame 220. Here, the first height H1 is a minimum height which allows the second sealing member 400 to be introduced into the through-hole 220a of the upper frame 220 to seal a gap between the through-hole 220a and the lead line 180. That is, in a single sealing process, the second sealing member 400 may be introduced into the gap between the first cover frame 211 and the side surface of the second thermally conductive plate 20 and introduced into the through-hole 220a to perform sealing of the upper frame 220.

Hereinafter, a thermoelectric module according to another embodiment of the present invention will be described with reference to FIG. 6.

FIG. 6 is a cross-sectional view illustrating a thermoelectric module according to another embodiment of the present invention.

As compared with the thermoelectric module 1000 according to one embodiment of the present invention shown in FIG. 3, a thermoelectric module 2000 shown in FIG. 6 has a different configuration including a second sealing member 400 and a third sealing member 500. Thus, hereinafter, only the different configuration including the second sealing member 400 and the third sealing member 500 will be described in detail, and detailed descriptions of duplicated reference numerals in the same configuration will be omitted herein.

In the thermoelectric module 2000 according to another embodiment of the present invention, after curing, the second sealing member 400 has a second height H2 at an end portion of an upper frame 220. Here, the second height H2 is a minimum height which allows the second sealing member 400 to seal a gap between the upper frame 220 and a side surface of the second thermally conductive plate 20. That is, since consumption of the second sealing member 400 may be reduced and may not need to fill to the first height H1, a process time may be reduced.

Meanwhile, the third sealing member 500 may fill a through-hole 220a when a filling process of the second sealing member 400 is performed.

Here, the third sealing member 500 may be made of the same material as the second sealing member 400 and may be a separate component from the second sealing member 400.

Alternatively, the third sealing member 500 may be made of a material having superior thermal conductivity as compared with that of the second sealing member 400 or may include a thermal conductivity additive to easily discharge heat of an accommodation space S in a cover frame 200 or resistance heat generated from a lead line 180 to the outside.

Hereinafter, a thermoelectric module according to still another embodiment of the present invention will be described with reference to FIG. 7.

FIG. 7 is a cross-sectional view illustrating a thermoelectric module according to still another embodiment of the present invention.

As compared with the thermoelectric module 1000 according to one embodiment of the present invention shown in FIG. 3, a thermoelectric module 3000 shown in FIG. 7 has a different configuration including a first outer frame 211', a first upper frame 221, a through-hole 210a, and a third sealing member 510. Thus, hereinafter, only the different configuration of the first outer frame 211', the first upper frame 221, the through-hole 210a, and the third sealing member 510 will be described in detail, and detailed descriptions of duplicated reference numerals in the same configuration will be omitted herein.

In the thermoelectric module 3000 according to still another embodiment of the present invention, a thickness T1 of the first outer frame 211' is larger than a thickness T2 of each of a second outer frame 212, a third outer frame 213, and a fourth outer frame 214.

In addition, as described above, as compared with an upper substrate 150, a first side surface of a lower substrate 140 further extends, and a lead line 180 may be connected to a lower electrode 161 on the extending first side surface. In this case, a through-hole 210a may be formed in the first upper frame 211' formed at a first side position at which the lead line 180, and the lead line 180 may pass through the through-hole 210a to be exposed to the outside of the cover frame 200.

As described above, a first thermally conductive plate 10 is connected to a surface of a cooling side (not shown), and thus it is easy to arrange a circuit board and a power supply line to a side at which the first thermally conductive plate 10 is disposed.

Therefore, in the thermoelectric module 3000 according to still another embodiment of the present invention, the through-hole 210a is formed in the first outer frame 211', and the lead line 180 is directly extracted to the first outer frame 211' so that a line pattern of the lead line 180 may be efficiently implemented.

In addition, the thickness T1 of the first outer frame 211', on which the through-hole 210a is formed, is formed to be larger than the thickness T2 of each of the outer frames 212, 213, and 214 on other sides so that it is possible to prevent disconnection of the lead line 180 in the through-hole 210a and maintain structural rigidity of the first outer frame 211'.

The third sealing member 510 may be made of the same material as a second sealing member 400 and may be a separate component from the second sealing member 400.

Alternatively, the third sealing member 510 may be made of a material having excellent thermal conductivity or may include a thermal conductivity additive to easily discharge heat of an accommodation space S in the cover frame 200 or resistance heat generated from the lead line 180 to the outside.

Here, the third sealing member 510 may include a cured contraction tube. For example, the lead line 180 may pass through the through-hole 210a formed in the first outer frame 211', and alternatively, may pass through the through-hole 210a in a state of being surrounded by the contraction tube. Thereafter, a sealant seals between the first outer frame 211', the through-hole 210a, and the contraction tube and then is dried. In addition, a pump is connected to the contraction tube, air in the thermoelectric module 3000 is discharged, and then heat is applied to the contraction tube so that the contraction tube may be contracted. Accordingly, an interior of the thermoelectric module 3000 may enter a vacuum state.

An example in which a sealing member includes a thermally cured contraction tube may be applied not only to the embodiment shown in FIG. 7, but also to other embodiments in this specification.

Hereinafter, a thermoelectric module according to yet another embodiment of the present invention will be described with reference to FIGS. 8A to 8C.

FIGS. 8A to 8C are cross-sectional views illustrating a thermoelectric module according to yet another embodiment of the present invention.

As compared with the thermoelectric module 1000 according to one embodiment of the present invention, the thermoelectric module shown in FIGS. 8A to 8C has a different connection structure between an upper frame 220 and a second thermally conductive plate 20. Thus, hereinafter, only a different configuration of the upper frame 220 and the second thermally conductive plate 20 will be described in detail, and detailed descriptions of duplicated reference numerals in the same configuration will be omitted herein.

First, referring to FIG. 8A, in the thermoelectric module according to yet another embodiment of the present invention, a corner formed by a top surface and a side surface of the upper frame 220 is located to be collinear with an imaginary center line CL1, which extends from a center of the second thermally conductive plate 20, in a height direction.

Thus, an accommodation space S may be expanded due to the cover frame 200, and a contact area between the upper frame 220 and the second thermally conductive plate 20 may be secured so that structural reliability and sealing efficiency of the thermoelectric module may be secured.

In addition, referring to FIG. 8B, in the thermoelectric module according to yet another embodiment of the present invention, a corner formed by a bottom surface and a side surface of the upper frame 220 is located to be coplanar with a bottom surface of the second thermally conductive plate 20.

Here, the corner formed by the upper surface and the side surface of the upper frame 220 is preferable to be located below the imaginary center line CL1 extending from the center of the side surface of the second thermally conductive plate 20 in the height direction so that a contact area between the upper frame 220 and the second thermally conductive plate 20 can be reduced as much as possible while securing structural reliability.

Therefore, the accommodation space S expands using the cover frame 200, and the contact area between the upper frame 220 and the second thermally conductive plate 20 is secured. Consequently, the structural reliability and sealing efficiency of the thermoelectric module may be secured as well as heat exchange between a heat radiation surface and a heat absorption surface of the thermoelectric module may be prevented using the upper frame 220 as efficient as possible.

In addition, referring to FIG. 8C, in the thermoelectric module according to yet another embodiment of the present invention, a bottom surface of the second thermally conductive plate 20 is located to be collinear with an imaginary center line CL2 extending from a center of the upper frame 220 in the height direction.

Here, the corner formed by the upper surface and the side surface of the upper frame 220 is preferable to be located below the imaginary center line CL1 extending from the center of the side surface of the second thermally conductive plate 20 in the height direction so that a contact area between the upper frame 220 and the second thermally conductive plate 20 can be reduced as much as possible while securing structural reliability.

Consequently, in a condition of preventing the heat exchange between the heat radiation surface and the heat absorption surface of the thermoelectric module using the upper frame 220 as efficient as possible, the accommodation space S expands using the cover frame 200 as much as possible, and the contact area between the upper frame 220 and the second thermally conductive plate 20 is secured at a required level or more so that the structural reliability of the thermoelectric module may be secured.

Hereinafter, an example in which the thermoelectric element according to the present invention is applied to a water purifier will be described with reference to FIG. 9.

FIG. 9 is a diagram illustrating an example in which the thermoelectric element according to the present invention is applied to a water purifier.

A water purifier 1 to which the thermoelectric element is applied includes a raw water supply pipe 12a, a water purification tank inlet pipe 12b, a water purification tank 12, a filter assembly 13, a cooling fan 14, a heat storage tank 15, a cold water supply pipe 15a, and the thermoelectric module 1000.

The raw water supply pipe 12a is a supply pipe for supplying water, which is a purification target, from a water source into the filter assembly 13, the water purification tank inlet pipe 12b is an inlet pipe for introducing the water, which is purified in the filter assembly 13, into the water purification tank 12, and the cold water supply pipe 15a is a supply pipe for finally supplying cold water, which is cooled at a predetermined temperature due to the thermoelectric module 1000 in the water purification tank 12, to a user.

The water purification tank 12 temporarily stores and supplies the water, which is purified by passing through the filter assembly 13 and is introduced through the water purification tank inlet pipe 12b, to the outside.

The filter assembly 13 includes a precipitation filter 13a, a pre carbon filter 13b, a membrane filter 13c, and a post carbon filter 13d.

That is, the water introduced into the raw water supply pipe 12a may be purified while passing through the filter assembly 13.

The heat storage tank 15 is disposed between the water purification tank 12 and the thermoelectric module 1000 and stores cold air formed in the thermoelectric module 1000. The cold air stored in the heat storage tank 15 is applied to the water purification tank 12 to cool the water accommodated in the water purification tank 12.

In order to facilitate transfer of the cold air, the heat storage tank 15 may be in surface contact with the water purification tank 12.

As described above, the thermoelectric module 1000 includes the heat absorption surface and the heat radiation surface, and one side of the thermoelectric module 1000 is cooled and the other side thereof is heated due to electron movements in a P-type semiconductor and an N-type semiconductor.

Here, the one side may be a side of the water purification tank 12, and the other side may be a side opposite to the water purification tank 12.

In addition, as described above, the thermoelectric module 1000 has excellent waterproof and dust-proof performance and improved heat flow performance so that the thermoelectric module 1000 may efficiently cool the water purification tank 12 in the water purifier.

Hereinafter, an example in which the thermoelectric element according to the present invention is applied to a refrigerator will be described with reference to FIG. 10.

FIG. 10 is a diagram illustrating an example in which the thermoelectric element according to the present invention is applied to a refrigerator.

The refrigerator includes a deep temperature evaporation chamber cover 23, an evaporation chamber partition wall 24, a main evaporator 25, a cooling fan 26, and a thermoelectric module 1000 in a deep temperature evaporation chamber.

An interior of the refrigerator is divided into a deep temperature storage chamber and the deep temperature evaporation chamber by the deep temperature evaporation chamber cover 23.

Specifically, an inner space corresponding to a front side of the deep temperature evaporation chamber cover 23 may be defined as the deep temperature storage chamber, and an inner space corresponding to a rear side of the deep temperature evaporation chamber cover 23 may be defined as the deep temperature evaporation chamber.

A discharge grille 23a and a suction grille 23b may be formed on a front surface of the deep temperature evaporation chamber cover 23.

The evaporation chamber partition wall 24 is installed at a position separated from a rear wall of an inner cabinet to the front side, thereby partitioning a space in which deep temperature storage system is provided from a space in which the main evaporator 25 is provided.

Cold air cooled by the main evaporator 25 is supplied to a freezing compartment and then returned to the main evaporator.

The thermoelectric module 1000 is accommodated in the deep temperature evaporation chamber and has a structure in which the heat absorption surface faces a drawer assembly and the heat radiation surface faces an evaporator. Thus, a heat absorption phenomenon generated due to the thermoelectric module 1000 may be utilized to rapidly cool food stored in the drawer assembly at an ultra-low temperature that is less than or equal to −50 degrees Celsius.

In addition, as described above, the thermoelectric module 1000 has excellent waterproof and dust-proof performance and improved heat flow performance so that the thermoelectric module 1000 may efficiently cool the drawer assembly in the refrigerator.

Hereinafter, an example of a thermoelectric leg of the thermoelectric element according to another embodiment of the present invention will be described with reference to FIGS. 11 to 13.

FIGS. 11 to 13 are diagrams illustrating an example of a thermoelectric leg of the thermoelectric element according to another embodiment of the present invention.

In another embodiment of the present invention, a structure of the above-described thermoelectric leg may be implemented as a structural body having a stacked structure instead of a bulk structure, thereby further improving thinness and cooling efficiency.

Specifically, a structure of each of the P-type thermoelectric leg 120 and the N-type thermoelectric leg in FIG. 11 is formed such that a plurality of structures, each of which is formed by applying a semiconductor material on a sheet-shaped substrate, are stacked to form a unit member, and then the unit member is cut. Thus, it is possible to prevent material loss and improve an electrical conductivity characteristic.

In this regard, referring to FIG. 11, FIG. 11 illustrates a conceptual diagram of a process of manufacturing a unit member having the above-described stacked structure.

Referring to FIG. 11, a material including a semiconductor material is prepared in the form of a paste, and the paste is applied on a base substrate 1110 such as a sheet, a film, or the like to form a semiconductor layer 1120 so that one unit member 1100 is formed. As shown in FIG. 11, the unit member 1100 is formed as a stacked structure by stacking a plurality of unit members 1100a, 1100b, and 1100c, and then the stacked structure is cut to form a unit thermoelectric element 1200. That is, the unit thermoelectric element 1200 according to the present invention may be formed in a structure in which a plurality of unit members 1100, in which the semiconductor layer 1120 is stacked on the base substrate 1110, are stacked.

In the above-described process, the applying of the semiconductor paste on the base substrate 1110 may be implemented using various methods. For example, the applying of the semiconductor paste may be implemented by tape casting, that is, by a process of mixing a very fine semiconductor material powder with an aqueous or non-aqueous solvent and any one selected from a binder, a plasticizer, a dispersant, a defoamer, and a surfactant to prepare a slurry and then forming the slurry on a moving blade or a moving carrier substrate according to a purpose with a predetermined thickness. In this case, a material, such as a film, a sheet, or the like, having a thickness in the range of 10 µm to 100 µm may be used as the base substrate, and the P-type material and the N-type material for manufacturing the above-described bulk-type element may also be directly applied as the semiconductor material being applied.

The unit members 1100 may be formed in a stacked structure by being compressed at a temperature ranging from 50° C. to 250° C. through the process of arranging and stacking the unit members 1100 in a multilayer. In an embodiment of the present invention, the number of the stacked unit members 1100 may range from two to fifty.

Thereafter, a cutting process may be performed in a desired shape and size, and a sintering process may be further performed.

A unit thermoelectric element formed by stacking the plurality of unit members 1100 manufactured according to the above-described processes may secure uniformity in thickness, shape, and size. That is, the existing bulk-shaped thermoelectric element is manufactured by pulverizing an ingot, finely ball-milling the pulverized ingot, and cutting a sintered bulk structure. Thus, there is a problem in that much material is lost, cutting in a uniform size is difficult, and thinness is difficult due to a thick thickness ranging from 3 mm to 5 mm. The unit thermoelectric element having the stacked structure according to the embodiments of the present invention is manufactured by stacking the sheet-shaped unit members in a multilayer and cutting the sheet-shaped stacked structure. Thus, a material is hardly lost and has a uniform thickness so that uniformity of the material may be secured, a thickness of the entire unit thermoelectric element may be reduced to 1.5 mm or less to achieve thinness, and the unit thermoelectric element may be applied in various shapes. Like the structure of the above-described thermoelectric leg according to one embodiment of the present invention in FIG. 2A, the finally implemented structure may be implemented by being cut into a regular hexahedral structure or a rectangular parallelepiped structure.

In particular, in the manufacturing process of the unit thermoelectric element according to another embodiment of the present invention, during the process of forming the stacked structure of the unit member 1100, the manufacturing process may be implemented to further include a process of forming a conductive layer on a surface of each unit member 1100.

That is, a conductive layer may be formed between the unit members of the stacked structure in FIG. 11C. The conductive layer may be formed on a surface opposite to a surface of the base substrate on which the semiconductor layer is formed. In this case, the conductive layer may be formed as a patterned layer to form a region in which the surface of the unit member is exposed. As compared with a case in which the conductive layer is applied on the entire surface of the base substrate, it is possible to realize an advantage of increasing electrical conductivity, improving adhesion strength between unit members, and reducing thermal conductivity.

That is, FIG. 12 illustrates various modified examples of a conductive layer C according to an embodiment of the present invention. The pattern that the surface of the unit member is exposed may be designed by being variously modified as a mesh type structure including closed-type opening patterns c1 and c2 shown in FIGS. 12A and 12B, or a line type including open-type opening patterns c3 and c4 shown in FIGS. 12C and 12D. As described above, the conductive layers implement an advantage of improving the adhesive strength between the unit members in the unit thermoelectric element formed of the stacked structure of the unit members, reducing the thermal conductivity between the unit members, and improving the electrical conductivity. Thus, as compared with the conventional bulk type thermoelectric element, a cooling capacity Qc and ΔT are improved and, particularly, a power factor is increased 1.5 times, that is, the electrical conductivity is increased 1.5 times The increase in electrical conductivity is directly related to improvement of thermoelectric efficiency so that cooling efficiency is increased. The conductive layer may be formed of a metal material, and all of metal-based electrode materials such as Cu, Ag, Ni, and the like may be applied.

When a unit thermoelectric leg having the above-described stacked structure in FIG. 11 is applied to the thermoelectric element shown in FIG. 2, that is, the thermoelectric element according to the embodiment of the present invention is disposed between the lower substrate 140 and the upper substrate 150 and the thermoelectric module is implemented as a unit cell with a structure including an electrode layer, a total thickness Th may be formed in the range of 1 mm to 1.5 mm so that it is possible to implement significant thinness as compared with using the existing bulk-type element.

In addition, as shown in FIG. 13A, the thermoelectric element in FIG. 11 is horizontally aligned in an upward direction and a downward direction and cut as shown in FIG. 13C so that the thermoelectric element according to the embodiment of the present invention may be implemented.

The structure shown in FIG. 13C may form a thermoelectric module with a structure in which surfaces of an upper substrate, a lower substrate, a semiconductor layer, and a base substrate are disposed adjacent to each other. However, as shown in FIG. 13B, the thermoelectric element also has a structure in which the thermoelectric element is vertically erected to allow a side surface of a unit thermoelectric element to be disposed adjacent to the upper substrate and the lower substrate. In such a structure, as compared with a horizontal arrangement structure, a distal end portion of the conductive layer is exposed on the side surface and it is possible to reduce thermal conductivity efficiency in a vertical direction and, simultaneously, improve an electrical conductivity characteristic so that cooling efficiency may be further increased.

As described above, in the thermoelectric element applied to the thermoelectric module of the present invention, which may be implemented in various examples, shapes and sizes of the P-type thermoelectric legs and the N-type thermoelectric legs facing each other are the same. In this case, in consideration that the electrical conductivity of the P-type thermoelectric leg and the electrical conductivity of the N-type thermoelectric leg are different from each other to act as a factor degrading the cooling efficiency, it is also possible to form a volume of one semiconductor device to be different from that of the other semiconductor device opposite to the one semiconductor device, thereby improving cooling performance.

While the present invention has been mainly described with reference to the exemplary embodiments, it should be understood that the present invention is not limited to the disclosed exemplary embodiments, and various modifications and applications can be devised by those skilled in the art to which the present invention pertains without departing from the gist of the present invention. For example, each component specifically shown in the exemplary embodiments can be modified and implemented. It should be construed that differences related to these modifications and applications will fall within the scope of the present invention defined by the appended claims.

DESCRIPTION OF REFERENCE NUMERALS

| | |
|---|---|
| 10: first thermally conductive plate | 20: second thermally conductive plate |
| 100: thermoelectric element | |
| 120: P-type thermoelectric leg | 130: N-type thermoelectric leg |
| 140: lower substrate | 150: upper substrate |
| 161: lower electrode | 162: upper electrode |
| 200: cover frame | |

The invention claimed is:

1. A thermoelectric module comprising:
a first thermally conductive plate;
a thermoelectric element disposed on the first thermally conductive plate;
a second thermally conductive plate disposed on the thermoelectric element and consisting of four vertically extending side surfaces; and
a cover frame disposed on the first thermally conductive plate and configured to form an accommodation space to accommodate the thermoelectric element in the accommodation space,
wherein the thermoelectric element includes:
a first insulating layer;
a thermoelectric leg disposed on the first insulating layer;
a second insulating layer disposed on the thermoelectric leg; and
electrodes including a first electrode disposed between the first insulating layer and the thermoelectric leg and a second electrode disposed between the second insulating layer and the thermoelectric leg, and
wherein the cover frame includes:
an outer frame disposed to be spaced apart from the thermoelectric element on the first thermally conductive plate; and
an upper frame extending downward toward the second thermally conductive plate from an upper end of the outer frame,
wherein a first sealing member is disposed on and across a top surface of the upper frame, so as to be in contact with the top surface of the upper frame and one of the four vertically extending side surfaces of the second thermally conductive plate.

2. The thermoelectric module of claim 1, wherein an angle between the outer frame and the top surface of the upper frame is an acute angle.

3. The thermoelectric module of claim 1, further comprising:
a second sealing member disposed between the outer frame and the first thermally conductive plate.

4. The thermoelectric module of claim 3, wherein:
an end of the upper frame and the one of the four vertically extending side surfaces of the second thermally conductive plate form a separation space; and
the first sealing member is disposed in the separation space.

5. The thermoelectric module of claim 1, further comprising a first lead line electrically connected to the first electrode and a second lead line electrically connected to the second electrode,
wherein at least one of the first lead line and the second lead line passes through a through-hole of the outer frame or a through-hole of the upper frame.

6. The thermoelectric module of claim 5, wherein the four vertically extending side surfaces of the second thermally conductive plate includes a first side surface, a second side surface, a third side surface, and a fourth side surface,
wherein the upper frame includes:
a first upper frame corresponding to the first side surface of the second thermally conductive plate;
a second upper frame corresponding to the second side surface of the second thermally conductive plate;
a third upper frame corresponding to the third side surface of the second thermally conductive plate; and
a fourth upper frame corresponding to the fourth side surface of the second thermally conductive plate, and
wherein a length of the first upper frame is greater than that of each of the second upper frame, the third upper frame, and the fourth upper frame.

7. The thermoelectric module of claim 6, wherein the through-hole of the upper frame is disposed in the first upper frame.

8. The thermoelectric module of claim 6, wherein a first angle between the outer frame and a top surface of the first upper frame is greater than a second angle between the outer frame and a top surface of each of the second upper frame, the third upper frame, and the fourth upper frame.

9. The thermoelectric module of claim 5, wherein the first insulating layer includes a first side surface, a second side surface, a third side surface, and a fourth side surface,
wherein the outer frame includes:
a first outer frame corresponding to the first side surface of the first insulating layer;
a second outer frame corresponding to the second side surface of the first insulating layer;
a third outer frame corresponding to the third side surface of the first insulating layer; and
a fourth outer frame corresponding to the fourth side surface of the first insulating layer, and
wherein a thickness of the first outer frame is greater than that of each of the second outer frame, the third outer frame, and the fourth outer frame.

10. The thermoelectric module of claim 9, wherein the through-hole of the outer frame is disposed in the first outer frame.

11. The thermoelectric module of claim 5, further comprising a third sealing member disposed between the through-hole and at least one of the first lead line and the second lead line.

12. The thermoelectric module of claim 4, wherein a center of the one of the four vertically extending side surfaces of the second thermally conductive plate is disposed to be collinear with a corner formed by the top surface and a side surface of the upper frame in a height direction.

13. The thermoelectric module of claim 4, wherein a corner formed by a bottom surface and the one of the four vertically extending side surfaces of the second thermally conductive plate is disposed to be collinear with a corner at which a bottom surface and a side surface of the upper frame meet.

14. The thermoelectric module of claim 13, wherein a corner formed by the top surface and the side surface of the upper frame is disposed below a center of the one of the four vertically extending side surfaces of the second thermally conductive plate in a height direction.

15. The thermoelectric module of claim 4, wherein a corner formed by a bottom surface and the one of the four vertically extending side surfaces of the second thermally conductive plate are disposed to be collinear with a center of the side surface of the upper frame in a height direction.

16. The thermoelectric module of claim 15, wherein a corner formed by the top surface and the side surface of the upper frame is disposed below a center of the one of the four vertically extending side surfaces of the second thermally conductive plate in the height direction.

17. The thermoelectric module of claim 1, wherein:
an area of the first thermally conductive plate is larger than that of the second thermally conductive plate.

18. The thermoelectric module of claim 17, wherein:
the first thermally conductive plate is disposed at a hot side of the thermoelectric element, and the second thermally conductive plate is disposed at a cold side of the thermoelectric element.

* * * * *